United States Patent
Flateau, Jr. et al.

(10) Patent No.: US 10,861,578 B1
(45) Date of Patent: Dec. 8, 2020

(54) DISTRIBUTED MEMORY REPAIR NETWORK

(71) Applicant: Xilinx, Inc., San Jose, CA (US)

(72) Inventors: Roger D. Flateau, Jr., San Jose, CA (US); Tomai Knopp, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/718,535

(22) Filed: Dec. 18, 2019

(51) Int. Cl.
*G11C 29/44* (2006.01)
*G11C 29/00* (2006.01)
*G11C 29/24* (2006.01)
*G11C 29/14* (2006.01)
*G11C 29/04* (2006.01)

(52) U.S. Cl.
CPC .......... *G11C 29/4401* (2013.01); *G11C 29/14* (2013.01); *G11C 29/24* (2013.01); *G11C 29/76* (2013.01); *G11C 2029/0403* (2013.01)

(58) Field of Classification Search
CPC ...... G11C 29/4401; G11C 29/14; G11C 29/24
See application file for complete search history.

(56) References Cited

U.S. PATENT DOCUMENTS

| 6,249,467 B1 * | 6/2001 | Pereira | G11C 15/00 365/200 |
| 2004/0210803 A1 * | 10/2004 | Cheng | G11C 29/44 714/710 |

* cited by examiner

*Primary Examiner* — Han Yang
(74) *Attorney, Agent, or Firm* — Amir Tabarrok, Rimon Law Firm Evolved

(57) ABSTRACT

A device includes a plurality of memory components with redundant columns associated therewith, a sub-block controller, and a volatile memory. The sub-block controller generates a repair vector, during manufacture testing mode. The repair vector is associated with the plurality of memory components and is generated responsive to detecting a defect within a column of the plurality of memory components. No repair vector is generated responsive to detecting no defect within a column of the plurality of memory components. The volatile memory receives and stores the repair vector in a nonvolatile memory component, during the manufacture testing mode. The volatile memory receives the repair vector from the nonvolatile memory component if the repair vector was generated during the manufacture testing mode, at startup mode, and provides it to the sub-block controller. The sub-block controller loads a repair data into the plurality of memory components based on the repair vector.

20 Claims, 9 Drawing Sheets

```
┌─────────────────────────────────────────────────────────────────┐
│ Generating a first repair vector, during manufacture testing    │
│ mode, associated with a first sub-block                         │
│                              610                                │
└─────────────────────────────────────────────────────────────────┘
                                 │
                                 ▼
┌─────────────────────────────────────────────────────────────────┐
│ Generating no repair vector for a second sub-block, during      │
│ manufacture testing mode                                        │
│                              620                                │
└─────────────────────────────────────────────────────────────────┘
                                 │
                                 ▼
┌─────────────────────────────────────────────────────────────────┐
│ Generating a third repair vector, during manufacture testing    │
│ mode, associated with a third sub-block                         │
│                              630                                │
└─────────────────────────────────────────────────────────────────┘
                                 │
                                 ▼
┌─────────────────────────────────────────────────────────────────┐
│ Storing the first and the third repair vectors in a first and   │
│ third volatile memories respectively, during manufacture        │
│ testing mode                                                    │
│                              640                                │
└─────────────────────────────────────────────────────────────────┘
                                 │
                                 ▼
┌─────────────────────────────────────────────────────────────────┐
│ Aggregating the first and the third repair vectors from the     │
│ first and the third volatile memories and storing the           │
│ aggregated repair vector in a nonvolatile memory component      │
│                              650                                │
└─────────────────────────────────────────────────────────────────┘
                                 │
                                 ▼
┌─────────────────────────────────────────────────────────────────┐
│ Receiving the first and the third repair vectors associated     │
│ with the first and the third sub-blocks respectively, the first │
│ repair vector is received by the first volatile memory from the │
│ nonvolatile memory component and the third repair vector is     │
│ received by the third volatile memory from the nonvolatile      │
│ memory component, at start up                                   │
│                              660                                │
└─────────────────────────────────────────────────────────────────┘
                                 │
                                 ▼
┌─────────────────────────────────────────────────────────────────┐
│ Receiving no repair vector associated with the second           │
│ sub-block, at start up                                          │
│                              670                                │
└─────────────────────────────────────────────────────────────────┘
                                 │
                                 └──────▶( A )
```

DISTRIBUTED MEMORY REPAIR NETWORK

TECHNICAL FIELD

The disclosure generally relates to a distributed memory repair network and more particularly a distributed memory repair network with fully developed and independent sub-blocks.

BACKGROUND

Redundant memory columns and build-in self repair (BISR) have been used to improve device yield by swapping damaged columns with good redundant columns. Accordingly, a part that would normally be thrown away may be used as a fully functioning device. In general, repair information is generated for each memory, during manufacturing test, to identify defective columns. However, repair information is generated for each memory component regardless of whether it contains a defective column or not. The repair information is stored in a non-volatile memory. Unfortunately, generating repair information for memory components that have no defective column wastes valuable non-volatile memory. Moreover, since the repair information is unique to the device, the non-volatile memory is embedded in the device, which adversely impacts scalability of the system. The repair information is then loaded from the non-volatile memory to a repairable memory, at every device startup. Accordingly, defective columns are replaced with good redundant columns. In order to reduce the amount of non-volatile memory needed, the repair information may be compressed when it is stored, and it is decompressed when it is being loaded. Typically, the repair information is serially shifted using low speed clock when it is being loaded at every device startup. As such, the larger the repair information is the longer it takes to load the information.

SUMMARY

Accordingly, a need has arisen for a BISR system that is scalable while reducing the amount of nonvolatile memory usage. Moreover, a need has arisen to improve the speed through which the repair information is loaded at each device startup to replace defective memory columns with good redundant columns. Moreover, a need has arisen to reduce routing, thereby reducing cost, by utilizing shared configuration bus to distribute repair information.

According to some embodiments, each sub-block is attached to a volatile memory component instead of a nonvolatile memory component. The volatile memory component of each sub-block is then connected to a nonvolatile memory component via a shared configuration bus. Accordingly, no repair information needs to be generated for sub-blocks with no defective columns, thereby reducing the number of repair information and as a result the amount of nonvolatile memory as well as improving the speed through which the repair information is loaded because fewer repair information is being loaded and sub-blocks that are not defective may be skipped. Furthermore, since each sub-block can be implemented independent of other sub-blocks, each sub-block may have its own standard memory repair network and the system as a whole becomes more scalable. It is appreciated that existing resources such as the shared configuration bus is used, thereby reducing the cost and complexity.

In some embodiments, a device includes a nonvolatile memory component, a first sub-block, and a second sub-block. The first sub-block includes a first plurality of memory components with redundant columns associated therewith, a first sub-block controller, and a first volatile memory. The first sub-block controller is configured to generate a first repair vector, during manufacture testing mode. The first repair vector is associated with the first plurality of memory components and is generated responsive to detecting a defect within a column of the first plurality of memory components. No repair vector is generated responsive to detecting no defect within a column of the first plurality of memory components. The first volatile memory is configured to receive the first repair vector and to store the first repair vector in the nonvolatile memory component, during the manufacture testing mode. The first volatile memory is configured to receive the first repair vector from the nonvolatile memory component, at startup mode, and provides the first repair vector to the first sub-block controller. The first sub-block controller is configured to load a first repair data into the first plurality of memory components based on the first repair vector. The second sub-block includes a second plurality of memory components with redundant columns associated therewith, a second sub-block controller, and a second volatile memory. The second sub-block controller is configured to generate a second repair vector, during the manufacture testing mode. The second repair vector is associated with the second plurality of memory components and is generated responsive to detecting a defect within a column of the second plurality of memory components. No repair vector is generated responsive to detecting no defect within a column of the second plurality of memory components. The second volatile memory is configured to receive the second repair vector and to store the second repair vector in the nonvolatile memory component, during the manufacture testing mode. The second volatile memory is configured to receive the second repair vector from the nonvolatile memory component, at startup mode, and provides the second repair vector to the second sub-block controller. The second sub-block controller is configured to load a second repair data into the second plurality of memory components based on the second repair vector.

It is appreciated that in some embodiments the first plurality of memory components comprises a random access memory (RAM). According to some embodiments, the first sub-block controller is a built-in self repair (BISR) controller. The device may further include a central processing unit configured to fetch the first and the second repair vectors. The central processing unit is further configured to aggregate the first and the second repair vectors to form an aggregated repair vector. The central processing unit is further configured to store the aggregated repair vector in the nonvolatile memory component.

In some embodiments, the device further includes a shared bus configured to transmit the first repair vector between the first sub-block and the nonvolatile memory. The shared bus is configured to transmit the second repair vector between the second sub-block and the nonvolatile memory.

According to some embodiments, the nonvolatile memory component is dynamically partitioned. It is appreciated that a partition is associated with a sub-block having a repair vector and each repair vector is tagged with a sub-block identifier.

It is appreciated that the first volatile memory component is configured to provide signal compliant interface to the first sub-block controller. In some embodiments, a repair function associated with the first sub-block is triggered responsive the first volatile memory receiving the first repair vector from the nonvolatile memory component.

In some embodiments, a device includes a plurality of memory components with redundant columns associated therewith, a sub-block controller, and a volatile memory. The sub-block controller is configured to generate a repair vector, during manufacture testing mode. The repair vector is associated with the plurality of memory components and is generated responsive to detecting a defect within a column of the plurality of memory components. No repair vector is generated responsive to detecting no defect within a column of the plurality of memory components. The volatile memory is configured to receive the repair vector and to store the repair vector in a nonvolatile memory component, during the manufacture testing mode. The volatile memory is configured to receive the repair vector from the nonvolatile memory component if the repair vector was generated during the manufacture testing mode, at startup mode, and provides the repair vector to the sub-block controller. The sub-block controller is configured to load a repair data into the plurality of memory components based on the repair vector.

It is appreciated that in some embodiments, the plurality of memory components comprises a random access memory (RAM). According to some embodiments, the sub-block controller is a built-in self repair (BISR) controller.

The repair vector is transmitted between the volatile memory and the nonvolatile memory using a shared bus. In some embodiments, the repair vector is tagged with a sub-block identifier. It is appreciated that the volatile memory component is configured to provide signal compliant interface to the sub-block controller. In some embodiments, a repair function is triggered responsive the volatile memory receiving the repair vector from the nonvolatile memory component.

In some embodiments, a method includes receiving a first repair vector associated with a first sub-block having a first plurality of memory components with at least one defect within a column associated therewith. The first repair vector is received by a first volatile memory component from a nonvolatile memory component, at startup. The method further includes loading a first repair data associated with the first repair vector into the first plurality of memory components, at startup. No repair vector is generated associated with a second sub-block having a second plurality of memory components with no defect within a column associated therewith, during manufacture testing mode. Accordingly, no repair vector associated with the second sub-block is received.

The method may further include generating the first repair vector, during manufacture testing mode. The first repair vector is associated with the first plurality of memory components and is generated responsive to detecting a defect within the column of the first plurality of memory components. The first repair vector is stored in a first volatile memory component associated with the first sub-block, during manufacture testing mode.

The method further includes generating a third repair vector, during the manufacture testing mode. The third repair vector is associated with the third plurality of memory components and is generated responsive to detecting a defect within the column of the third plurality of memory components. The third repair vector is stored in a third volatile memory component associated with the third sub-block, during manufacture testing mode.

The method further includes receiving the third repair vector associated with a third sub-block having a third plurality of memory components with at least one defect within a column associated therewith. The third repair vector is received by a third volatile memory component from the nonvolatile memory component, at startup. A third repair data associated with the third repair vector is loaded into the third plurality of memory components, at startup.

The method further includes aggregating the first repair vector and the third repair vector from the first volatile and the third volatile memory components respectively. The aggregated repair vector is stored in the nonvolatile memory.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

FIGS. 6A-6B show a flow chart of a distributed memory repair network, according to some examples.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
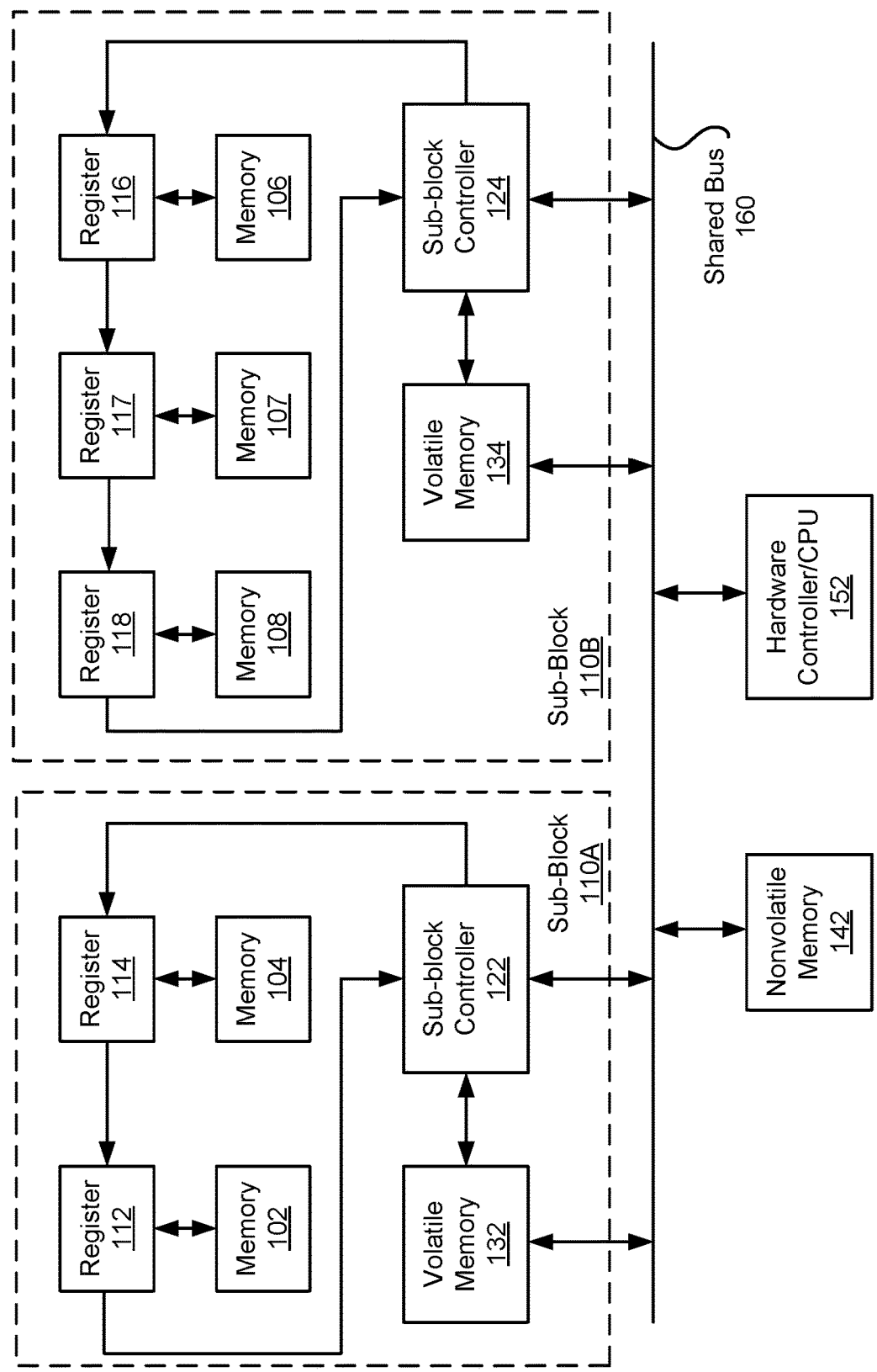
FIG. 1 shows a block diagram depicting a distributed memory repair network, according to some examples.

Examples described herein relate to a BISR system that is scalable while it reduces the amount of nonvolatile memory usage. Moreover, the BISR system according to some embodiments improves the speed through which the repair information is loaded at each device startup to replace defective memory columns with good redundant columns. The BISR system according to some embodiments also reduces routing, thereby reducing cost, by utilizing shared configuration bus to distribute repair information.

According to some embodiments, each sub-block is attached to a volatile memory component instead of a nonvolatile memory component. The volatile memory component of each sub-block is then connected to a nonvolatile memory component via a shared configuration bus. Accordingly, no repair information needs to be generated for sub-blocks with no defective columns, thereby reducing the number of repair information and as a result the amount of nonvolatile memory as well as improving the speed through which the repair information is loaded because fewer repair information is being loaded and sub-blocks that are not defective may be skipped. Furthermore, since each sub-block can be implemented independent of other sub-blocks, each sub-block may have its own standard memory repair network and the system as a whole becomes more scalable. It is appreciated that existing resources such as the shared configuration bus is used, thereby reducing the cost and complexity.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. For example, various methods according to some examples can include more or fewer operations, and the sequence of operations in various methods according to examples may be different than described herein. In addition, an illustrated example need not have all the aspects or advantages shown. An aspect or an advantage described in conjunction with a particular example is not necessarily limited to that example and can be practiced in any other examples even if not so illustrated or if not so explicitly described.

Some general concepts will first be described to clarify terms and nomenclature used throughout this description.

FIG. 1 shows a block diagram depicting a distributed memory repair network, according to some examples. The system illustrates a sub-block 110A and a sub-block 110B, coupled to a nonvolatile memory 142, e.g., magnetic random access memory (MRAM), embedded flash, e-fuse, etc., and a hardware controller/central processing unit (CPU) 152 via a shared bus 160, e.g., shared configuration bus. Each sub-block may be a BISR system that is capable of swapping defective columns with good redundant columns, independent of other sub-blocks. For example, sub-block 110A may be a BISR system that is capable of swapping defective columns within the sub-block 110A with good redundant columns also within the sub-block 110A independent of other sub-blocks, e.g., sub-block 110B.

Sub-block 110A may include memory components 102 and 104, e.g., RAM, that are coupled to the sub-block controller 122. The sub-block controller 122, e.g., BISR controller, is coupled to a volatile memory component 132, e.g., cache. It is appreciated that during a manufacturing test, the sub-block controller 122 tests the memory components 102 and 104 within the sub-block 110A for any defective columns. If a defective column is detected, the sub-block controller 122 generates a repair information (also referred to as repair vector) associated with the memory components 102 and 104 within the sub-block 110A. It is appreciated that in some embodiments, a repair vector for the entire sub-block 110A is generated if the sub-block controller 122 detects a defective column in the memory component 102. Similarly, a repair vector for the entire sub-block 110A is generated if the sub-block controller 122 detects a defective column in the memory component 104. However, it is appreciated that no repair vector is generated if no defective column is detected. In the conventional systems, the repair vectors are generated regardless of whether a defective column is detected or not. Also, in the conventional system the repair vectors are stored in a nonvolatile memory. In this embodiment, however, the repair vector (if generated in response to detecting a defective column) is stored in a volatile memory component 132. The volatile memory component 132 is configured to provide signal compliant interface to the sub-block controller 122 and also configured to store the repair vectors temporarily.

Sub-block 110B may include memory components 106, 107, and 108, e.g., RAM, that are coupled to the sub-block controller 124. The sub-block controller 124, e.g., BISR controller, is coupled to a volatile memory component 134, e.g., cache. It is appreciated that during a manufacturing test, the sub-block controller 124 test the memory components 106, 107, and 108 within the sub-block 110B for any defective column. If a defective column is detected, the sub-block controller 124 generates a repair information associated with the memory components 106, 107, and 108 within the sub-block 110B. It is appreciated that in some embodiments, a repair vector for the entire sub-block 110B is generated if the sub-block controller 124 detects a defective column in the memory component 106. Similarly, a repair vector for the entire sub-block 110B is generated if the sub-block controller 124 detects a defective column in the memory component 107. Similarly, a repair vector for the entire sub-block 110B is generated if the sub-block controller 124 detects a defective column in the memory component 108. However, it is appreciated that no repair vector is generated if no defective column is detected. In the conventional systems, the repair vectors are generated regardless of whether a defective column is detected or not. Also, in the conventional systems the repair vectors are stored in a nonvolatile memory. In this embodiment, however, the repair vector (if generated in response to detecting a defective column) is stored in a volatile memory component 134. The volatile memory component 134 is configured to provide signal compliant interface to the sub-block controller 124 and also configured to store the repair vectors temporarily.

It is appreciated that at the end of manufacturing test sequence, a higher level function such system software, e.g., via the hardware controller/CPU 152 or direct tester control, may fetch the repair vectors from the volatile memory component of each sub-block, e.g., volatile memory 132 and 134. It is appreciated that no repair vector is fetched from volatile memory 132 of sub-block 110A if sub-block 110A contains no defective column and similarly no repair vector is fetched from the volatile memory 134 of sub-block 110B if sub-block 110B contains no defective column. The fetched repair vectors may be aggregated, e.g., using the hardware controller/CPU 152, and stored in the nonvolatile memory 142. In some embodiments, the repair vectors may be compressed prior to storage in the nonvolatile memory 142. It is appreciated that the size of nonvolatile memory 142 can be reduced since sub-blocks that contain no defective column do not generate a repair vector. In other words, only repair vectors that are needed to repair a memory component are stored on-chip. It is further appreciated that the cost is reduced by using shared resources, e.g., shared configuration bus 160.

It is appreciated that in a second mode, e.g., during device startup, a higher level function such system software, e.g., using hardware controller/CPU 152, read the stored repair vectors from the nonvolatile memory component 142. If the repair vectors are compressed, the system software may decompress the information.

The repair vectors are then communicated to the respective volatile memory components. For example, if sub-block 110A contains a defective column, then the repair vector fetched from the nonvolatile memory 142 is communicated to the volatile memory 132 via the hardware controller/CPU 152 and the shared bus 160. The BISR repair function associated with sub-block 110A may be triggered once the repair vector is received by the volatile memory 132. The sub-block controller 122 may distribute the repair vector received from the volatile memory 132 to the memory components 102 and 104. In some embodiments, registers 112 and 114 may be used to align redundant column for the repair column through the shift chain for respective memory components 102 and 104. As such, the repair vector (if generated in response to detecting a defective column) is loaded for each sub-block, at startup. Similarly, if sub-block 110B contains a defective column, then the repair vector fetched from the nonvolatile memory 142 is communicated to the volatile memory 134 via the hardware controller/CPU 152 and the shared bus 160. The BISR repair function associated with sub-block 110B may be triggered once the repair vector is received by the volatile memory 134. The sub-block controller 124 may distribute the repair vector received from the volatile memory 134 to the memory components 106, 107, and 108. In some embodiments, registers 116, 117, and 118 may be used to align redundant column for the repair column through the shift chain for respective memory components 106, 107, and 108.

It is appreciated that since each sub-block utilizes its own respective volatile memory component, each sub-block can be designed with its own respective BISR function and connected to the network without a need to redesign the network. In other words, the network becomes scalable as any number of sub-blocks can be added to the system without a need to redesign the network. Moreover, using shared resources such as a configuration bus enables the slow dedicated routing lines to be eliminated, therefore improving the speed through which the loading of repair vectors occurs at device startup. Furthermore, smaller amount of nonvolatile memory is used because sub-blocks without any defective column do not generate a repair vector, thereby eliminating the need to store repair vector in absence of a defective columns. It is further appreciated that the number of registers, memories, and sub-blocks that are shown are for illustrative purposes and should not be construed as limiting the scope of the embodiments.

Figure 2:
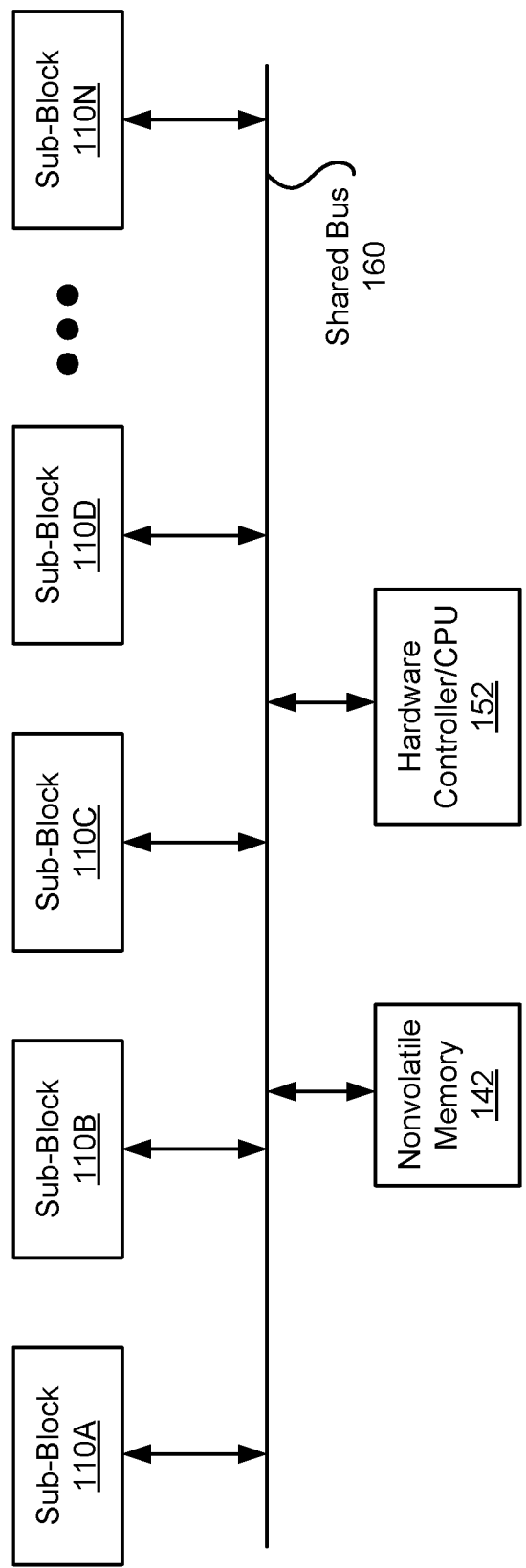
FIG. 2 shows a block diagram depicting a distributed memory repair network with multiple sub-blocks, according to some examples.

FIG. 2 shows a block diagram depicting a distributed memory repair network with multiple sub-blocks, according to some examples. In this embodiment, sub-blocks 110A, 110B, 110C, 110D, . . . , 110N are connected to the nonvolatile memory 142 and the hardware controller/CPU 152 via the shared bus 160. It is appreciated that each sub-block may be substantially similar to those described in FIG. 1.

Figure 3:
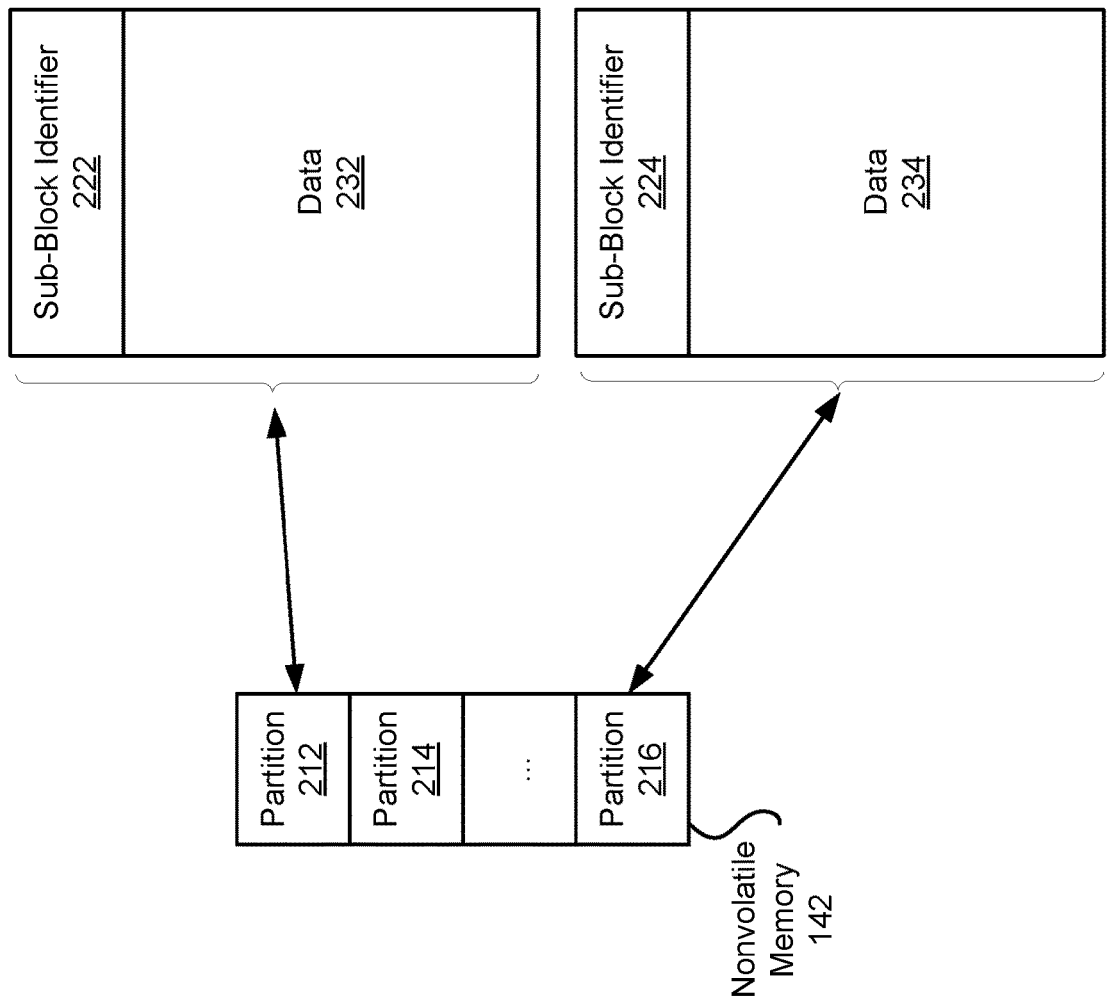
FIG. 3 shows a nonvolatile memory component that is partitioned for a distributed memory repair network, according to some examples.

FIG. 3 shows a nonvolatile memory component that is partitioned for a distributed memory repair network, according to some examples. As discussed above, the nonvolatile memory 142 is shared between sub-blocks that require repair. For example, if a sub-block does not have a defective column then the nonvolatile memory 142 is not shared with that sub-block as no repair vector is generated for that sub-block. This is in contrast to the conventional system where repair vectors are generated for each sub-block regardless of whether they contain any defective columns, thereby requiring as many nonvolatile bits as the repair vector size and resulting in larger nonvolatile memory needed. It is appreciated that the nonvolatile memory 142 may be dynamically partitioned and allocated. For example, once repair vectors for sub-blocks that contain defective columns are generated and are being stored from the volatile memory into the nonvolatile memory, the appropriate partitions within the nonvolatile memory 142 are created. For example, if two repair vectors are generated, hence two sub-blocks with defective columns, then two partitions are dynamically allocated within the nonvolatile memory 142. In this illustrative example, a first repair vector includes data 232, which may or may not be compressed. As such, partition 212 associated with the first repair vector is created. It is appreciated that the first repair vector may include sub-block identifier 222 that identifies which sub-block it comes from. Similarly, a second repair vector may include data 234, which may or may not be compressed. As such, partition 216 associated with the second repair vector is created. It is appreciated that the second repair vector may include sub-block identifier 224 that identifies the sub-block that it belongs to that requires repair. It is appreciated that the nonvolatile memory 142 may include other partitions as well, e.g., partition 214.

It is appreciated that each sub-block identifier may include a wide array of identifier information. For example, sub-block identifier may include a tag associated with the sub-block that it comes from, it may also include the size of the repair vector, partial addresses, offsets, etc. In other words, to ensure that the correct repair vector is loaded to the correct sub-block, each repair vector is tagged with an identifier that identifies its corresponding sub-block. Accordingly, the nonvolatile memory component 142 may divide the reserved nonvolatile memory into individual repair vectors that can be loaded on demand by a higher level functions such as system software.

Figure 4:
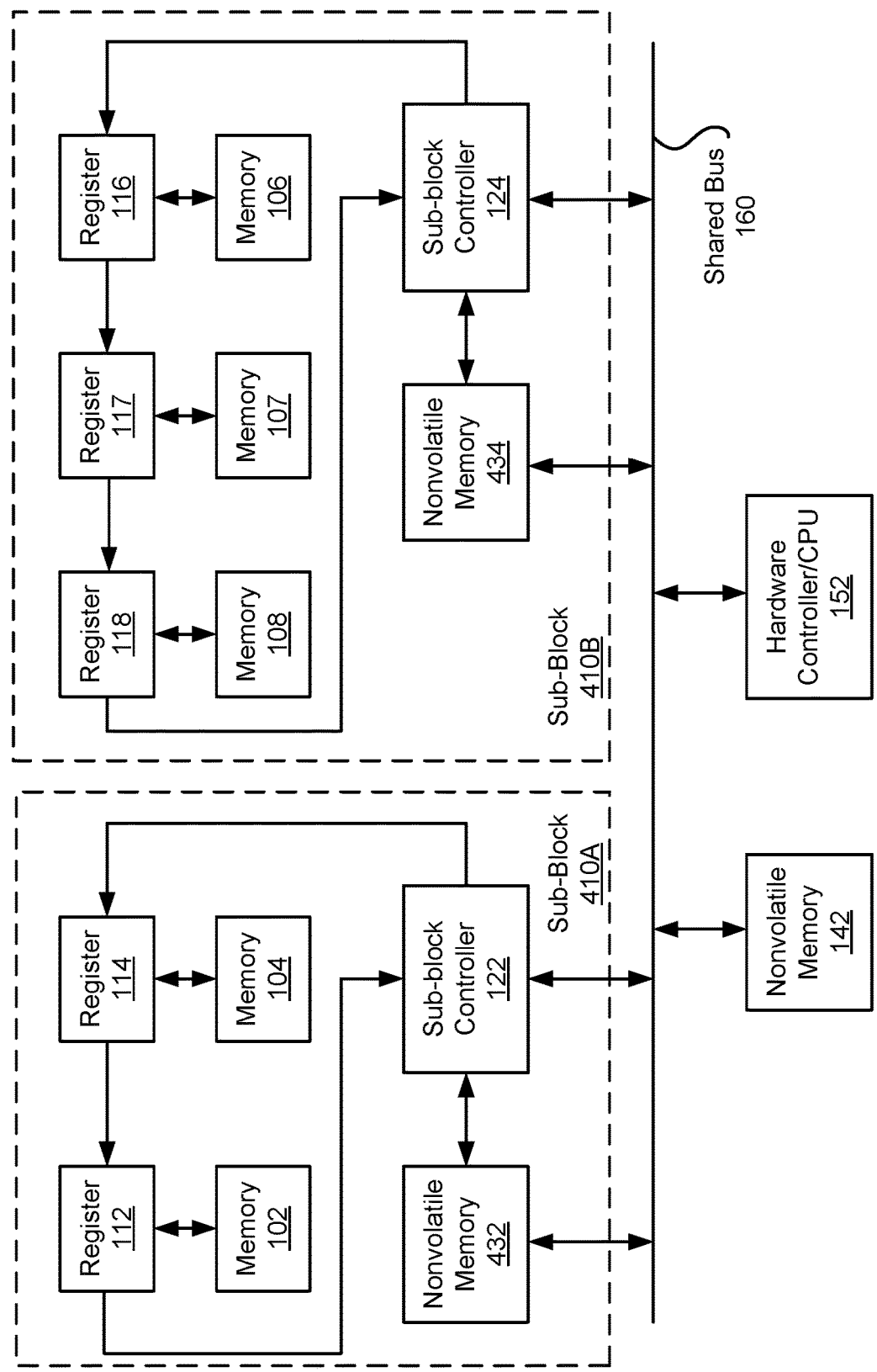
FIG. 4 shows a block diagram depicting another distributed memory repair network, according to some examples.

FIG. 4 shows a block diagram depicting another distributed memory repair network, according to some examples. It is appreciated that FIG. 4 is substantially similar to FIG. 1 except that each sub-block uses a nonvolatile memory instead of a volatile memory. For example, sub-block 410A may include a nonvolatile memory 432 and sub-block 4106 may include a nonvolatile memory 434. It is appreciated that since each sub-block includes its own nonvolatile memory, it can operate independent of other sub-blocks, therefore improving the scalability of the network.

Figure 5:
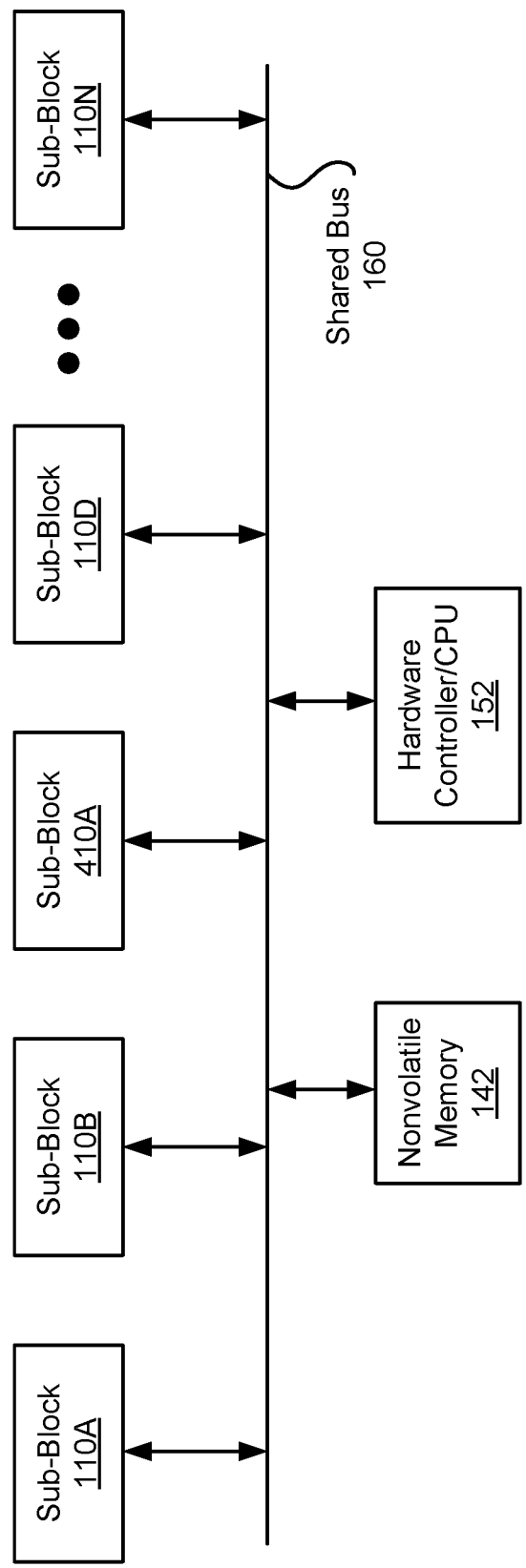
FIG. 5 shows another bock diagram depicting another distributed memory repair network with multiple sub-blocks, according to some examples.

FIG. 5 shows another bock diagram depicting another distributed memory repair network with multiple sub-blocks, according to some examples. FIG. 5 is similar to that of FIGS. 1, 2, and 4 and it operates substantially similar thereto. In this embodiment, the system includes sub-blocks 110A, 110B, 110D, . . . , 110N and sub-block 410A that are coupled to the hardware controller/CPU 152 and the nonvolatile memory 142 via the shared bus 160. It is appreciated that the system therefore utilizes a combination of sub-blocks where some sub-blocks include volatile memory components whereas other sub-blocks include nonvolatile memory components.

Figure 6B:
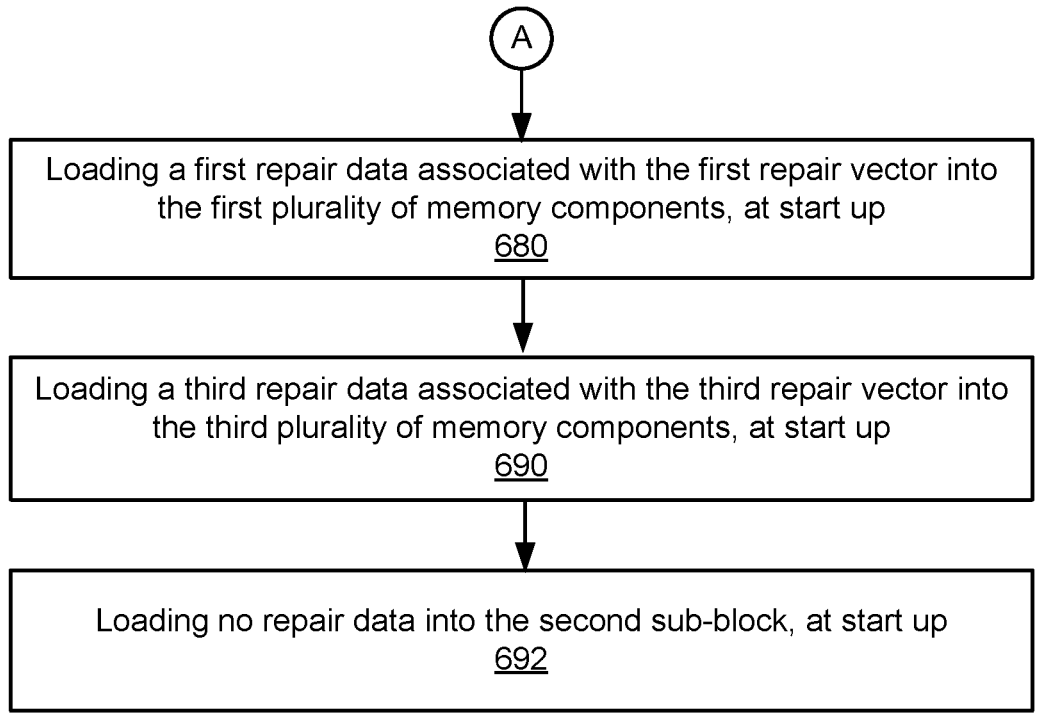

FIGS. 6A-6B show a flow chart of a distributed memory repair network, according to some examples. At step 610, a first repair vector associated with a first sub-block is generated during manufacture testing mode. It is appreciated that the first repair vector is generated only if the first sub-block includes a defective memory column, as described in FIGS. 1-5. At step 620, no repair vector is generated for a second sub-block, during manufacture testing, if the second sub-block contains no defective column, as described in FIGS. 1-5. At step 630, a third repair vector associated with a third sub-block is generated, during manufacture testing mode, if the third sub-block contains a defective column, as described in FIGS. 1-5.

At step 640, the first and the third repair vectors are stored in the first and the third volatile memory components, during the manufacture testing mode, as described in FIGS. 1-5. At step 650, the first and the third repair vectors may be aggregated and stored in a nonvolatile memory from the volatile memories, using a higher level software function, as described in FIGS. 1-5. In some embodiments, the repair vectors are compressed before storing in the nonvolatile memory.

At step 660, the repair vectors are received, during device startup. For example, the first and the third repair vectors that are associated with the first and the third sub-blocks are received, from the nonvolatile memory, respectively by the volatile memory components of the first and the third sub-blocks. It is appreciated that at step 670, no repair vector is received for the second sub-block, at startup, since it includes no defective column and since no repair vector was generated or stored for the second sub-block.

At step 680, the first repair data associated with the first repair vector is loaded into the memory components of the first sub-block, at startup, and as described in FIGS. 1-5. At step 690, a third repair data associated with the third repair vector is loaded into the memory components of the third sub-block, at startup, and as described in FIGS. 1-5. It is appreciated that the repair data may be interface compliant for the respective controller of the sub-block and therefore it may be in a different format than the repair vector that was stored in the nonvolatile memory. It is appreciated that at step 692, no repair data is loaded into the second sub-block, at startup, since the second sub-block includes no defective column.

Figure 7:
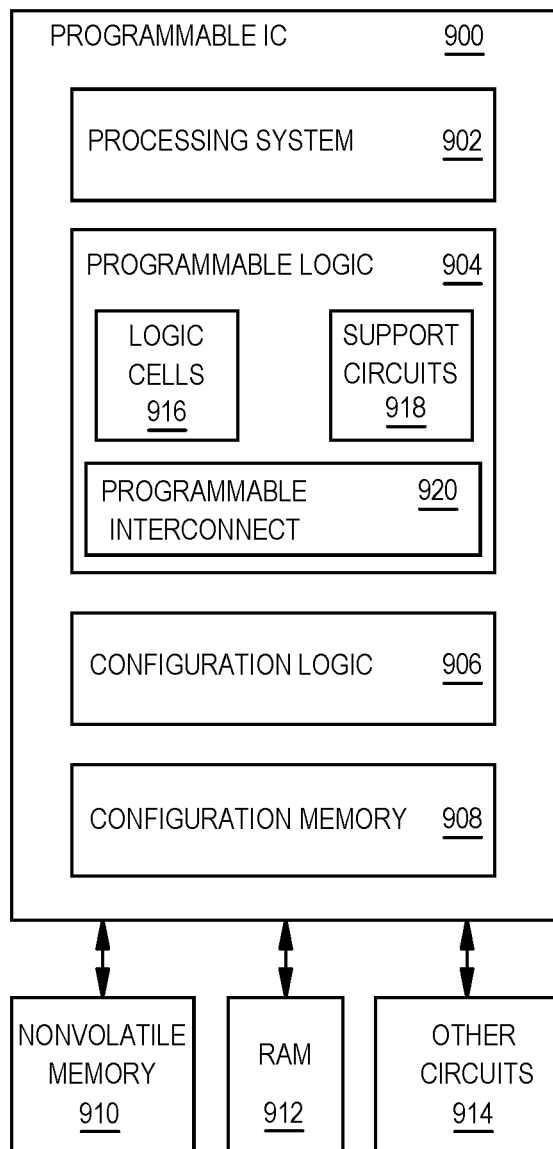
FIG. 7 is a block diagram depicting a programmable integrated circuit (IC), according to some examples.

FIG. 7 is a block diagram depicting a programmable integrated circuit (IC) 900 according to an example. The programmable IC 900 can implement the integrated circuit (IC) chip of systems of FIGS. 1-6B, in whole or in part. The programmable IC 900 includes a processing system 902, programmable logic 904, configuration logic 906, and configuration memory 908. The programmable IC 900 can be coupled to external circuits, such as nonvolatile memory 910, RAM 912, and other circuits 914.

In the example of FIG. 7, the processing system 902 can include microprocessor(s), memory, support circuits, IO circuits, and the like. The programmable logic 904 includes logic cells 916, support circuits 918, and programmable interconnect 920. The logic cells 916 include circuits that can be configured to implement general logic functions of a plurality of inputs. The support circuits 918 include dedicated circuits, such as transceivers, input/output blocks, digital signal processors, memories, and the like. The logic cells and the support circuits 918 can be interconnected using the programmable interconnect 920. Information for programming the logic cells 916, for setting parameters of the support circuits 918, and for programming the programmable interconnect 920 is stored in the configuration memory 908 by the configuration logic 906. The configuration logic 906 can obtain the configuration data from the nonvolatile memory 910 or any other source (e.g., the RAM 912 or from the other circuits 914).

Figure 8:
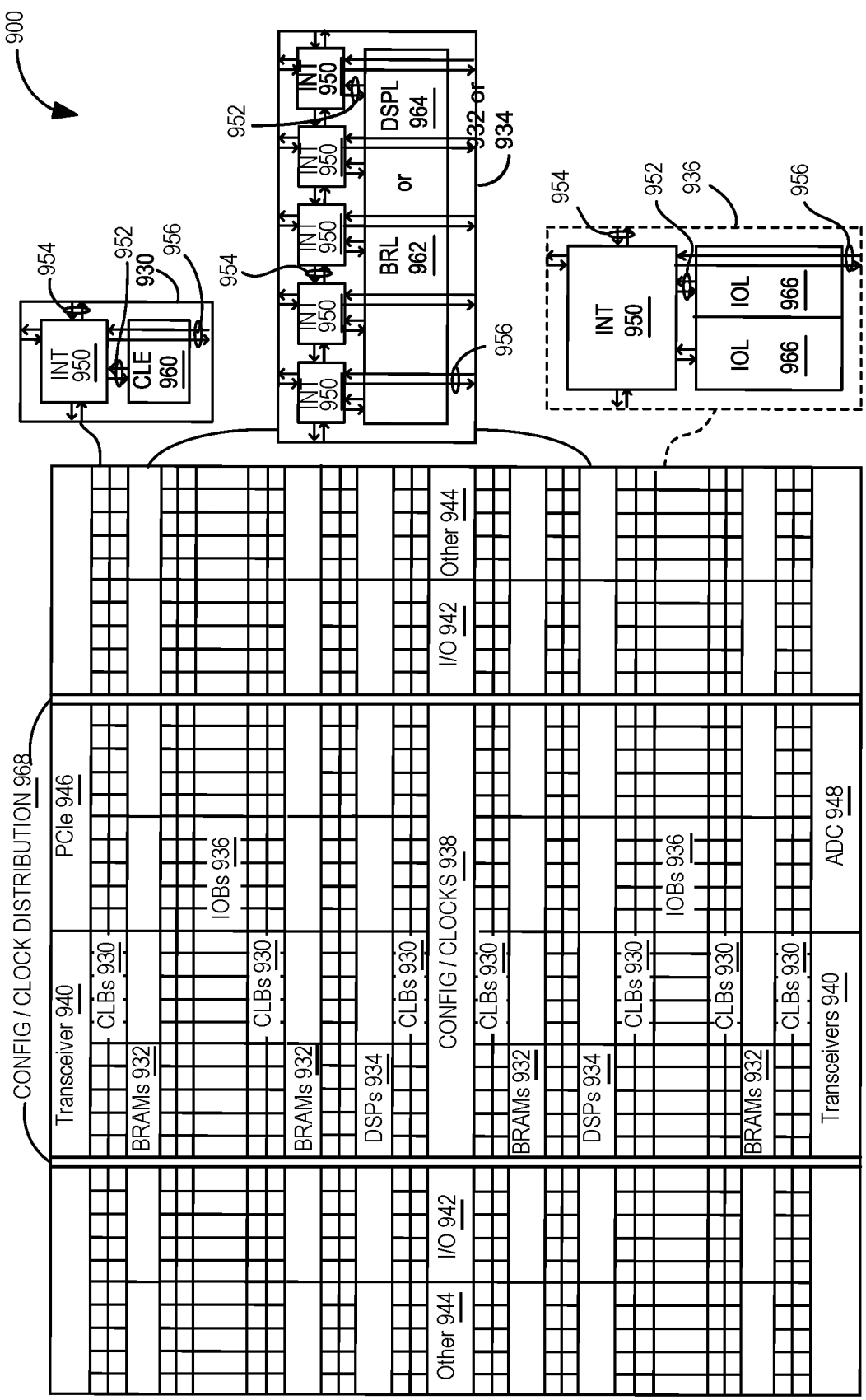
FIG. 8 is a field programmable gate array (FPGA) implementation of the programmable IC, according to some examples.

FIG. 8 illustrates an FPGA implementation of the programmable IC 900 that includes a large number of different programmable tiles including configurable logic blocks ("CLBs") 930, random access memory blocks ("BRAMs") 932, signal processing blocks ("DSPs") 934, input/output blocks ("IOBs") 936, configuration and clocking logic ("CONFIG/CLOCKS") 938, digital transceivers 940, specialized input/output blocks ("I/O") 942 (e.g., configuration ports and clock ports), and other programmable logic 944 such as digital clock managers, system monitoring logic, and so forth. The FPGA can also include PCIe interfaces 946, analog-to-digital converters (ADC) 948, and the like.

In some FPGAs, each programmable tile can include at least one programmable interconnect element ("INT") 950 having connections to input and output terminals 952 of a programmable logic element within the same tile, as shown by examples included in FIG. 8. Each programmable interconnect element 950 can also include connections to interconnect segments 954 of adjacent programmable interconnect element(s) in the same tile or other tile(s). Each programmable interconnect element 950 can also include connections to interconnect segments 956 of general routing resources between logic blocks (not shown). The general routing resources can include routing channels between logic blocks (not shown) comprising tracks of interconnect segments (e.g., interconnect segments 956) and switch blocks (not shown) for connecting interconnect segments. The interconnect segments of the general routing resources (e.g., interconnect segments 956) can span one or more logic blocks. The programmable interconnect elements 950 taken together with the general routing resources implement a programmable interconnect structure ("programmable interconnect") for the illustrated FPGA.

In an example implementation, a CLB 930 can include a configurable logic element ("CLE") 960 that can be programmed to implement user logic plus a single programmable interconnect element ("INT") 950. A BRAM 932 can include a BRAM logic element ("BRL") 962 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 934 can include a DSP logic element ("DSPL") 964 in addition to an appropriate number of programmable interconnect elements. An IOB 936 can include, for example, two instances of an input/output logic element ("IOL") 966 in addition to one instance of the programmable interconnect element 950. As will be clear to those of skill in the art, the actual I/O pads connected, for example, to the input/output logic element 966 typically are not confined to the area of the input/output logic element 966.

In the pictured example, a horizontal area near the center of the die is used for configuration, clock, and other control logic. Vertical columns 968 extending from this horizontal area or column are used to distribute the clocks and configuration signals across the breadth of the FPGA.

Some FPGAs utilizing the architecture illustrated in FIG. 8 include additional logic blocks that disrupt the regular columnar structure making up a large part of the FPGA. The additional logic blocks can be programmable blocks and/or dedicated logic.

Note that FIG. 8 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 8 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A device comprising:
   a nonvolatile memory component;
   a first sub-block comprising:
      a first plurality of memory components with redundant columns associated therewith;
      a first sub-block controller configured to generate a first repair vector responsive to detecting a defect within a column of the first plurality of memory components; and
      a first volatile memory configured to receive the first repair vector and to store the first repair vector in the nonvolatile memory component, and wherein the first volatile memory is configured to receive the first repair vector from the nonvolatile memory component and to provide the first repair vector to the first sub-block controller that loads a first repair data into the first plurality of memory components based on the first repair vector; and
   a second sub-block comprising:
      a second plurality of memory components with redundant columns associated therewith;
      a second sub-block controller configured to generate a second repair vector responsive to detecting a defect within a column of the second plurality of memory components, and wherein the second sub-block controller operates independently from the first sub-block controller; and
      a second volatile memory configured to receive the second repair vector and to store the second repair vector in the nonvolatile memory component, and wherein the second volatile memory is configured to receive the second repair vector from the nonvolatile memory component and to provide the second repair vector to the second sub-block controller that loads a second repair data into the second plurality of memory components based on the second repair vector.

2. The device of claim 1, wherein the first plurality of memory components comprises a random access memory (RAM).

3. The device of claim 1 further comprising a controller unit configured to fetch the first and the second repair vectors and is further configured to aggregate the first and the second repair vectors to form an aggregated repair vector, and wherein the controller unit is further configured to store the aggregated repair vector in the nonvolatile memory component.

4. The device of claim 1 further comprising a shared bus configured to transmit the first repair vector between the first sub-block and the nonvolatile memory, and wherein the shared bus is configured to transmit the second repair vector between the second sub-block and the nonvolatile memory.

5. The device of claim 1, wherein the nonvolatile memory component is dynamically partitioned, wherein a partition is associated with a sub-block having a repair vector, and wherein each repair vector is tagged with a sub-block identifier.

6. The device of claim 1, wherein the first sub-block controller is a built-in self repair (BISR) controller.

7. The device of claim 1, wherein the first volatile memory component is configured to provide signal compliant interface to the first sub-block controller.

8. The device of claim 1, wherein a repair function associated with the first sub-block is triggered responsive the first volatile memory receiving the first repair vector from the nonvolatile memory component.

9. A device comprising:
   a plurality of memory components with redundant columns associated therewith;
   a sub-block controller configured to generate a repair vector, during manufacture testing mode, wherein the repair vector is associated with the plurality of memory components and is generated responsive to detecting a defect within a column of the plurality of memory components, and wherein no repair vector is generated responsive to detecting no defect within a column of the plurality of memory components; and
   a volatile memory configured to receive the repair vector and to store the repair vector in a nonvolatile memory component, during the manufacture testing mode, and wherein the volatile memory is configured to receive the repair vector from the nonvolatile memory component if the repair vector was generated during the manufacture testing mode, at startup mode, and provides the repair vector to the sub-block controller, wherein the sub-block controller is configured to load a repair data into the plurality of memory components based on the repair vector.

10. The device of claim 9, wherein the plurality of memory components comprises a random access memory (RAM).

11. The device of claim 9, wherein the repair vector is transmitted between the volatile memory and the nonvolatile memory using a shared bus.

12. The device of claim 9, wherein the repair vector is tagged with a sub-block identifier.

13. The device of claim 9, wherein the sub-block controller is a built-in self repair (BISR) controller.

14. The device of claim 9, wherein the volatile memory component is configured to provide signal compliant interface to the sub-block controller.

15. The device of claim 9, wherein a repair function is triggered responsive the volatile memory receiving the repair vector from the nonvolatile memory component.

16. A method comprising:
   receiving a first repair vector associated with a first sub-block having a first plurality of memory components with at least one defect within a column associated therewith, wherein the first repair vector is received by a first volatile memory component from a nonvolatile memory component, at startup;
   loading a first repair data associated with the first repair vector into the first plurality of memory components, at startup;
   generating no repair vector associated with a second sub-block having a second plurality of memory components with no defect within a column associated therewith, during manufacture testing mode; and
   receiving no repair vector associated with the second sub-block.

17. The method of claim 16 further comprising:
   generating the first repair vector, during manufacture testing mode, wherein the first repair vector is associated with the first plurality of memory components and is generated responsive to detecting a defect within the column of the first plurality of memory components; and storing the first repair vector in a first volatile memory component associated with the first sub-block, during manufacture testing mode.

18. The method of claim 17 further comprising:

receiving a third repair vector associated with a third sub-block having a third plurality of memory components with at least one defect within a column associated therewith, wherein the third repair vector is received by a third volatile memory component from the nonvolatile memory component, at startup; and loading a third repair data associated with the third repair vector into the third plurality of memory components, at startup.

19. The method of claim 18 further comprising:

generating the third repair vector, during the manufacture testing mode, wherein the third repair vector is associated with the third plurality of memory components and is generated responsive to detecting a defect within the column of the third plurality of memory components; and storing the third repair vector in a third volatile memory component associated with the third sub-block, during manufacture testing mode.

20. The method of claim 19 further comprising:

aggregating the first repair vector and the third repair vector from the first volatile and the third volatile memory components respectively; and storing the aggregated repair vector in the nonvolatile memory.

* * * * *